US007668682B2

(12) United States Patent
Gonzalez et al.

(10) Patent No.: US 7,668,682 B2
(45) Date of Patent: Feb. 23, 2010

(54) METHOD AND CIRCUIT FOR DETECTING AND COMPENSATING FOR A DEGRADATION OF A SEMICONDUCTOR DEVICE

(75) Inventors: Christopher Gonzalez, Shelburne, VT (US); Vinod Ramadurai, South Burlington, VT (US); Norman Jay Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 11/923,701

(22) Filed: Oct. 25, 2007

(65) Prior Publication Data

US 2009/0108863 A1    Apr. 30, 2009

(51) Int. Cl.
*G06F 17/50* (2006.01)
*G06F 11/22* (2006.01)

(52) U.S. Cl. ............... 702/117; 702/182; 702/118; 716/1; 716/4; 714/724

(58) Field of Classification Search ........... 702/182, 702/117
See application file for complete search history.

(56) References Cited

U.S. PATENT DOCUMENTS

| 5,600,578 | A | * | 2/1997 | Fang et al. ............... 703/14 |
| 5,764,073 | A | | 6/1998 | Sadamatsu |
| 5,966,024 | A | * | 10/1999 | Bui et al. ............... 324/763 |
| 5,982,225 | A | | 11/1999 | Forhan et al. |
| 6,298,450 | B1 | * | 10/2001 | Liu et al. ............... 713/502 |
| 6,476,632 | B1 | | 11/2002 | LaRosa et al. |
| 7,338,817 | B2 | * | 3/2008 | Liu et al. ............... 438/10 |
| 2002/0012272 | A1 | | 1/2002 | Shukuri et al. |
| 2002/0191445 | A1 | | 12/2002 | Shukuri et al. |
| 2004/0078711 | A1 | | 4/2004 | King et al. |
| 2004/0223389 | A1 | | 11/2004 | Shukuri et al. |
| 2005/0134394 | A1 | | 6/2005 | Liu |

FOREIGN PATENT DOCUMENTS

| JP | 1025548 A | 1/1989 |
| JP | 7128384 A | 5/1995 |

OTHER PUBLICATIONS

Office Action (Mail Date Mar. 18, 2009) for U.S. Appl. No. 11/463,911, Filing Date Aug. 11, 2006; Confirmation No. 7719.
Notice of Allowance (Mail Date Jun. 1, 2009) for U.S. Appl. No. 11/463,911, Filing Date Aug. 11, 2006; Confirmation No. 7719.

* cited by examiner

*Primary Examiner*—Hal D Wachsman
(74) *Attorney, Agent, or Firm*—Schmeiser, Olsen & Watts; Michael J. LeStrange

(57) ABSTRACT

A design structure and method comprising a degradation detection circuit configured to respond to degradation. The degradation detection circuit is located within a semiconductor device and comprises a process sensitive circuit, a measurement circuit, a calculation circuit, and a control circuit. The method comprises subjecting the semiconductor device to a first operating condition. A first value at a first time for a parameter of the process sensitive circuit is measured by the measurement circuit. The semiconductor device is operated to perform an intended function. A second value at a second time for the parameter of the circuit is measured by the measurement circuit. The second time is different from the first time. A first differential value between the first value and the second value is determined by the calculation circuit. The control circuit is configured to receive an enable signal.

13 Claims, 4 Drawing Sheets

METHOD AND CIRCUIT FOR DETECTING AND COMPENSATING FOR A DEGRADATION OF A SEMICONDUCTOR DEVICE

This application is related to U.S. patent application Ser. No. 11/463,911, filed on Aug. 11, 2006 and currently pending.

BACKGROUND OF THE INVENTION

1. Technical Field

The present invention relates to a circuit design structure and method for detecting and compensating for a degradation of a semiconductor device.

2. Related Art

Devices within an electrical structure typically degrade over time thereby causing the electrical structure to malfunction or operate inefficiently. Thus, there is a need for a structure and associated method for compensating for devices within an electrical structure that degrade over time.

SUMMARY OF THE INVENTION

The present invention provides a degradation detection method, comprising:

providing, a semiconductor device comprising a monitor circuit system, said monitor circuit system comprising a process sensitive circuit, a measurement circuit, and a calculation circuit;

subjecting, said semiconductor device to a first operating condition;

first measuring, by said measurement circuit, a first value at a first time for a parameter of said process sensitive circuit;

operating after said first measuring, said semiconductor device such that said semiconductor device performs at least one intended function;

second measuring, by said measurement circuit, a second value at a second time for said parameter of said process sensitive circuit, said second time differing from said first time; and determining, by said calculation circuit, a first differential value between said first value and said second value.

The present invention provides a semiconductor device, comprising:

a process sensitive circuit;

a measurement circuit, wherein said semiconductor device is adapted to be subjected to a first operating condition, wherein said measurement circuit is adapted to measure a first value for a parameter of said process sensitive circuit at a first time, wherein said semiconductor device is adapted to be operated such that said semiconductor device performs at least one intended function, wherein said measurement circuit is adapted to measure a second value for said parameter of said process sensitive at a second time, and wherein said second time differs from said first time; and a calculation circuit adapted to determine a first differential value between said first value and said second value.

The present invention provides a design structure embodied in a machine readable medium used in a design process, the design structure comprising:

a process sensitive circuit;

a measurement circuit, wherein said semiconductor device is adapted to be subjected to a first operating condition, wherein said measurement circuit is adapted to measure a first value for a parameter of said process sensitive circuit at a first time, wherein said semiconductor device is adapted to be operated such that said semiconductor device performs at least one intended function, wherein said measurement circuit is adapted to measure a second value for said parameter of said process sensitive at a second time, and wherein said second time differs from said first time;

a calculation circuit adapted to determine a first differential value between said first value and said second value; and a control circuit configured to receive an enable signal.

The present invention advantageously provides a design structure and associated method for compensating for devices within an electrical structure that degrade over time.

DETAILED DESCRIPTION OF THE INVENTION

Figure 1:
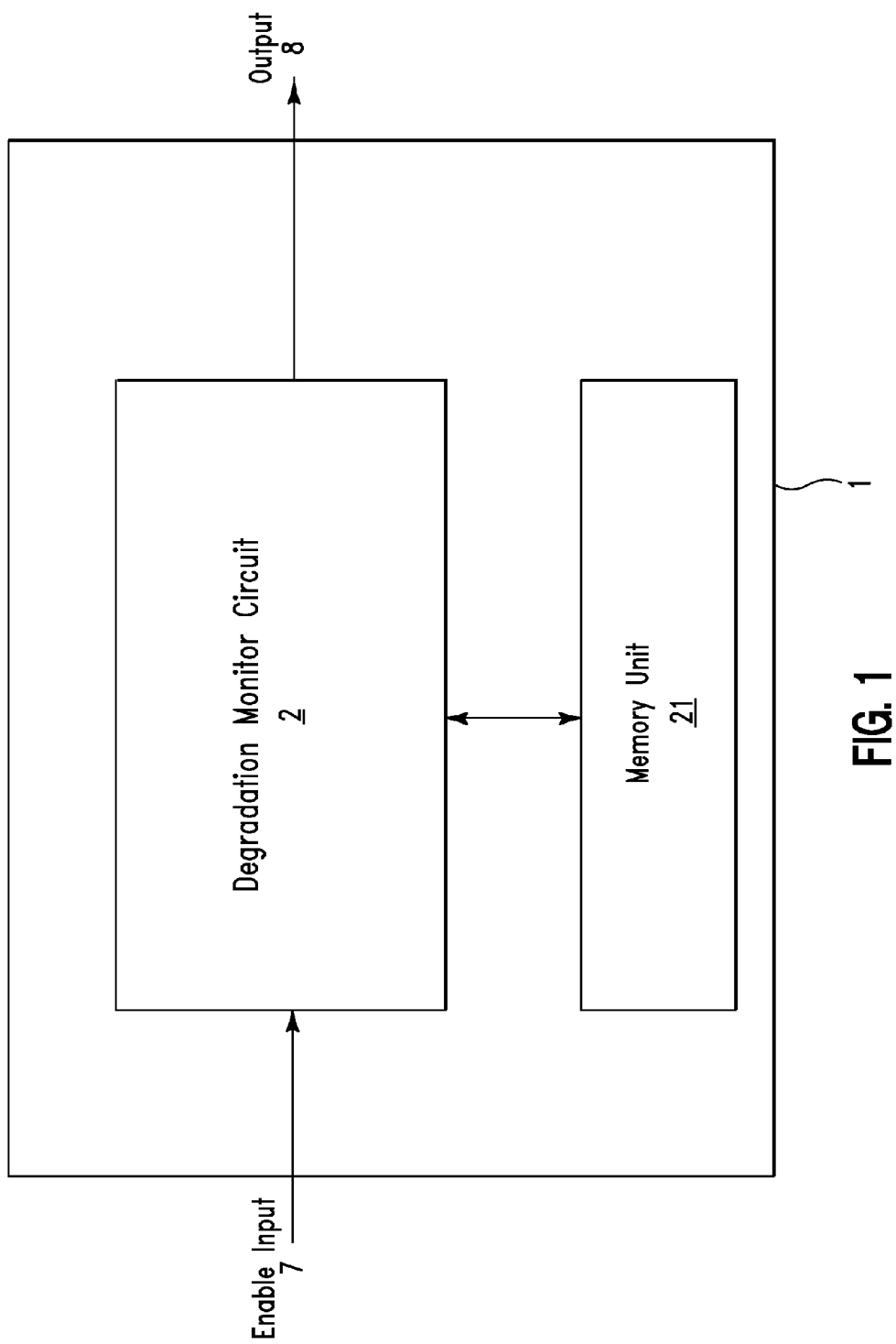
FIG. 1 illustrates a block diagram of a semiconductor device comprising a degradation monitor circuit, in accordance with embodiments of the present invention.

FIG. 1 illustrates a block diagram of a semiconductor device 1 comprising a degradation monitor circuit 2 and a memory unit 21, in accordance with embodiments of the present invention. The memory unit 21 may comprise a non-volatile memory structure such as, inter alia, an e-fuse memory structure, a laser fuse memory structure, a random access memory (RAM) structure, etc. The semiconductor device 1 may comprise any type of semiconductor device including, inter alia, a semiconductor chip, a central processing unit (CPU), digital to analog converter, etc. The degradation monitor circuit 2 is a configurable circuit system comprising a plurality of circuits (e.g., see the internal schematic view in FIG. 2) and is used for detecting and accounting for semiconductor device degradation over time. Semiconductor device degradation is defined herein as the degrading of components (e.g., transistors, resistors, etc) and/or circuits within a semiconductor device caused by operation or usage of the semiconductor device. Once the degradation monitor circuit 2 has detected that the semiconductor device 1 has degraded, it may take several actions including, inter alia, sending a message to a user of the degradation monitor circuit 2 so that the user may adjust an operating condition(s) for the semiconductor device 1 in order to prevent semiconductor device 1 failure, automatically adjusting an operating condition(s) for the semiconductor device 1, etc. A message to the user of the degradation monitor circuit 2 may comprise any type of message including, inter alia, a visual message, an audible message, etc. Operating conditions for the semiconductor device 1 may include, inter alia, an operating or supply voltage for the semiconductor device 1, an operating or supply current for the semiconductor device 1, an operating temperature for the semiconductor device 1, a data flow to the semiconductor device 1, etc.

An enable signal (e.g., a logical 1) is applied to an enable input 7 for the degradation monitor circuit 2 in order to initialize a process for detecting semiconductor device 1 degradation over time. First, the semiconductor device 1 (including the degradation monitor circuit 2) is subjected to a first operating condition. For example, the first operating condition may comprise a first supply voltage (e.g., 1 volt) applied to the semiconductor device 1. A first value for a first parameter (e.g., resistance) of a circuit within degradation monitor circuit 2 (e.g., see process sensitive circuit(s) in FIG. 2) is measured at a first time and is stored in memory unit 21. The first parameter may comprise, inter alia, a delay for the circuit, a current for the circuit, a resistance for the circuit, a voltage for the circuit, etc. After the first value for the first parameter is measured, the semiconductor device 1 is operated under normal conditions. For example, if the semiconductor device is a CPU, then the CPU may be operated in a computer performing intended functions (e.g., performing calculations, performing control functions, running software, etc). After the semiconductor device 1 is operated under normal conditions for a specified time, a second value for the first parameter (e.g., resistance) of the circuit within degradation monitor circuit 2 (e.g., see process sensitive circuit(s) in FIG. 2) is measured at a second time (i.e., at the first operating condition) and stored in memory unit 21. A differential value between the first value and the second value is calculated by the degradation monitor circuit 2 and compared to a predetermined threshold value stored in memory unit 21. The predetermined threshold value may be determined by any means including, inter alia, experimentation, known values, etc.

If the differential value is greater than the predetermined threshold value then a notification is sent via the output 8 to indicate that the semiconductor device 1 has degraded and a system interrupt (i.e., to disable the semiconductor device 2) may be performed. The degradation monitor circuit 2 may suggest a change (i.e., change to the operating condition) for the semiconductor device 1 to ensure operability (i.e., to account for degradation). For example, the suggested change may comprise, inter alia, to lower an operating frequency, raise an operating voltage, change a workload, etc. The notification and suggested change may be sent to a user (e.g., a computer operator) of the semiconductor device 1 so that the user may manually change the first operating condition to a second operating condition (e.g., the first supply voltage of 1 volt is changed to a supply voltage of 1.1 volts). Alternatively, the suggested change may be sent to a system comprising the semiconductor device 1 (e.g., a computer comprising the semiconductor device 1) so that the system may automatically change the first operating condition to a second operating condition (e.g., the first supply voltage of 1 volt is changed to a supply voltage of 1.1 volts). For example, if the semiconductor device 1 is a CPU in a computer system, then the suggested change may be sent to the computer system so that the computer system may automatically make the suggested change to the operating condition. Upon making the suggested change from the first operating condition to the second operating condition (e.g., the first supply voltage of 1 volt is changed to a supply voltage of 1.1 volts) the aforementioned process may be performed again using the second operating condition to determine more semiconductor device 1 degradation. Additionally, the aforementioned process may be performed periodically.

If the differential value is less than the predetermined threshold value then a determination is made that the semiconductor device 1 has not degraded and the semiconductor device 1 is again operated at normal conditions at the first operating condition. The aforementioned measurement process may be performed again at a later time (e.g., periodically) to determine if the semiconductor device 1 has degraded at the later time.

Note that any operating condition for the semiconductor device 1 may be changed to perform the aforementioned process. For example, a temperature for the semiconductor device 1 may be changed by directing a heating source (e.g., a heater) or a cooling source (e.g., a fan, a heat sink, etc) at the semiconductor device 1 (i.e., subjecting the semiconductor device 1 to the operating condition).

Figure 2:
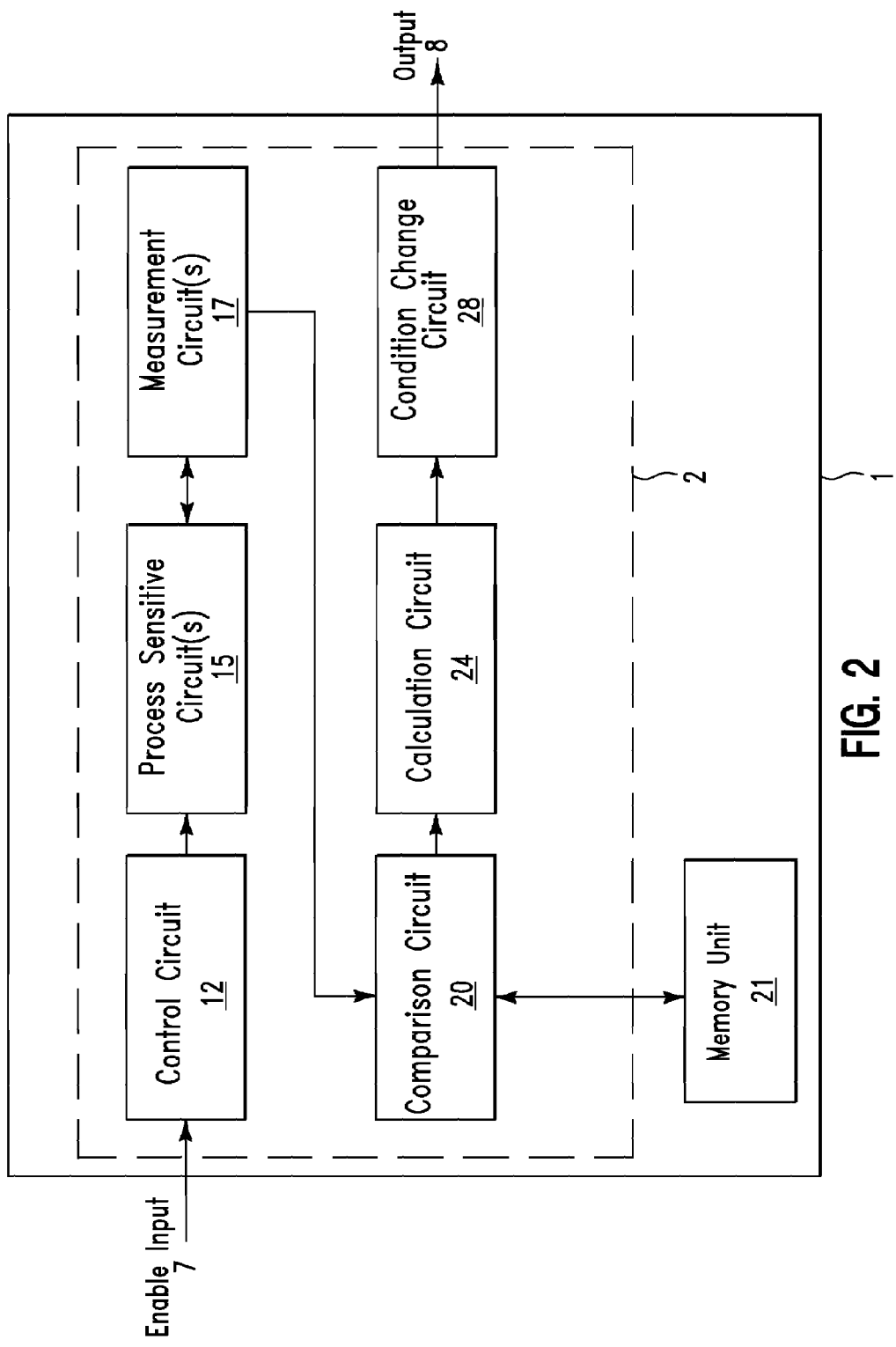
FIG. 2 illustrates an internal schematic for the degradation monitor circuit of FIG. 1, in accordance with embodiments of the present invention.

FIG. 2 illustrates an internal schematic for the degradation monitor circuit 2 of FIG. 1, in accordance with embodiments of the present invention. The internal schematic for the degradation monitor circuit 2 in FIG. 2 represents an example configuration of components for the degradation monitor circuit 2. Note that any configuration of any components may be used. The degradation monitor circuit 2 comprises a control circuit 2, process sensitive circuit(s) 15, measurement circuit(s) 17, comparison circuit 20, calculation circuit 24, and condition change circuit 28. The control circuit 12 comprises digital logic circuitry (i.e., a collection of digital gates, such as, inter alia, NAND gates, NOR gates, latches, etc) and is used to control and enable the degradation monitor circuit 2. The control circuit 12 receives an enable signal in order to initialize a process for detecting semiconductor device 1 degradation over time. The process sensitive circuit(s) 15 comprises a plurality of test circuits used in the parameter measurement process as described with reference to FIG. 1. The process sensitive circuit(s) 15 may comprise a plurality of different test circuits each one producing a different type of output. For example, a first circuit may comprise be a ring oscillator circuit comprising inverters, a second circuit may comprise a ring oscillator circuit comprising latches, a third circuit may comprise a circuit that produces a current as an output, etc. The outputs of these circuits may comprise a voltage, a frequency, a current, any electrical measurement, etc.

After the semiconductor device 1 including the process sensitive circuit(s) 15 is subjected to a first operating condition. For example, the first operating condition may comprise a first supply voltage (e.g., 1 volt) applied to the semiconductor device 1. A first value for a first parameter (e.g., with respect to a ring oscillator circuit a first parameter may comprise a frequency) of one of the process sensitive circuit(s) 15 is measured at a first time and is stored in memory unit 21. The first parameter is measured by the measurement circuits 17. Additionally, the measurement circuits 17 convert all measured parameters to digital values. For example, if one of process sensitive circuit(s) 15 produces a voltage, then an analog to digital converter within measurement circuits 17 is used to convert an analog voltage to a digital number. Likewise, if one of process sensitive circuit(s) 15 produces a frequency (e.g., ring oscillator circuit), then the measurement circuits 17 would convert the analog frequency to a digital number. After the first value for a first parameter is measured and stored in memory unit 21, the semiconductor device 1 is operated under normal conditions. After the semiconductor device 1 is operated under normal conditions for a specified time, a second value for the first parameter of the process sensitive circuit(s) 15 is measured again at a second time (i.e., at the first operating condition) and stored in memory unit 21. The comparison circuit 20 compares the first value to the second value and the calculation circuit 24 calculates a differential value between the first value and the second value. The comparison circuit 20 may comprise comparator circuitry (e.g., digital comparators) to compare a given process sensitive circuit's current value (i.e., second value) to its initial value (i.e., first value). For example, at the beginning of its life a ring oscillator might have a measured frequency of 1 GHz but after running for a while it might now have a measured frequency of 900 MHz. The differential value between the first value and the second value is compared (i.e., by the comparison circuit 24) to a predetermined threshold value stored in memory unit 21.

If the differential value is greater than the predetermined threshold value then a notification may be sent via the output 8 to indicate that said semiconductor device 1 has degraded. The condition change circuit 28 may use a pre-calculated algorithm to produce a system interrupt (i.e., for the semiconductor device 2) and suggest a change (i.e., calculated by the calculation circuit 24) to the operating condition for the semiconductor device 2 to ensure operability and account for degradation. For example, condition change circuit 28 could ask a system operating the semiconductor device 2 to lower its operating frequency, raise its voltage, change its workload, etc. The notification and suggested change may be sent to a user of the semiconductor device 1 so that the user may manually change the first operating condition to a second operating condition (e.g., the first supply voltage of 1 volt is changed to a supply voltage of 1.1 volts). Alternatively, the suggested change may be sent to a system comprising the semiconductor device 1 so that the system may automatically change the first operating condition to a second operating condition (e.g., the first supply voltage of 2 volts is changed to a supply voltage of 1 volt). For example, if the semiconductor device 1 is a CPU in a computer system, then the suggested change may be sent to the computer system so that the computer system may automatically make the suggested change. Upon making the suggested change from the first operating condition to the second operating condition (e.g., the first supply voltage of 2 volts is changed to a supply voltage of 1 volt) the aforementioned process is performed again using the second operating condition to determine further degradation.

If the differential value is less than the predetermined threshold value then a determination is made that the semiconductor device 1 has not degraded and the semiconductor device 1 is again operated at normal conditions.

The aforementioned measurement process may be performed again at a later time (e.g., periodically) to determine if the semiconductor device 1 has degraded at the later time. Additionally the aforementioned process may be performed using a plurality of circuit within the process sensitive circuits 15 as illustrated by the following example of implementation for the degradation monitor circuit 2 of FIGS. 1 and 2.

In the example a process degradation monitor circuit 2 comprises two circuits: a ring oscillator circuit comprising regular threshold voltage (RVT) devices and a ring oscillator circuit comprising high threshold voltage devices (HVT) as the process sensitive circuits 15. After the semiconductor device 1 is manufactured it is tested. During the test the control circuit 12 will test (either in parallel or sequentially) the RVT circuit and the HVT circuit. In the example, the RVT circuit and the HVT circuit are tested sequentially. The control circuit 12 will enable the RVT circuit and the measurement circuit 17 will measure a frequency of its output. The measurement circuit 17 measures a value of 1 GHz for a parameter (i.e., frequency) of the RVT circuit. The value (i.e., 1 GHz) is stored in the memory unit 21. Next, the control circuit 12 enables the HVT circuit and the measurement circuit 17 measures a value of 0.5 GHz. This value is also stored in the memory unit 21. These two values (1 GHz and 0.5 GHz) are stored as time T0 valued measurements for each circuit.

The semiconductor device 1 is now put into operation and periodically (e.g., during boot-up, every hour, every day, etc), the process degradation monitor circuit 2 interrogates the RVT circuit and the HVT circuit. Every time the control circuit 12 enables the RVT circuit and the HVT circuit, the measurement circuit 17 measures output values, the comparison circuit 20 compares values, the calculation circuit 24 calculates a delta frequency from time T0, and the condition change circuit 28 provides semiconductor device 1 recommendations. For example, the process degradation monitor circuit 2 re-measures the HVT circuit and the RVT circuit and compares the re-measure values to the T0 values. Currently, the HVT circuit measures 0.5 GHz and the RVT circuit measures 0.9 GHz. The process degradation monitor circuit 2 compares the current HVT circuit value of 0.5 GHz to the T0 value of 0.5 GHz and because there is no change there are no system changes recommended. The RVT circuit T0 value of 1.0 GHz is compared to the 0.9 MHz current value. Based on a delta of 10% between the T0 value and the current value, the condition change circuit 28 will send signals to the system requesting either the system to slow down or the operating voltage to be raised, etc.

Figure 3:
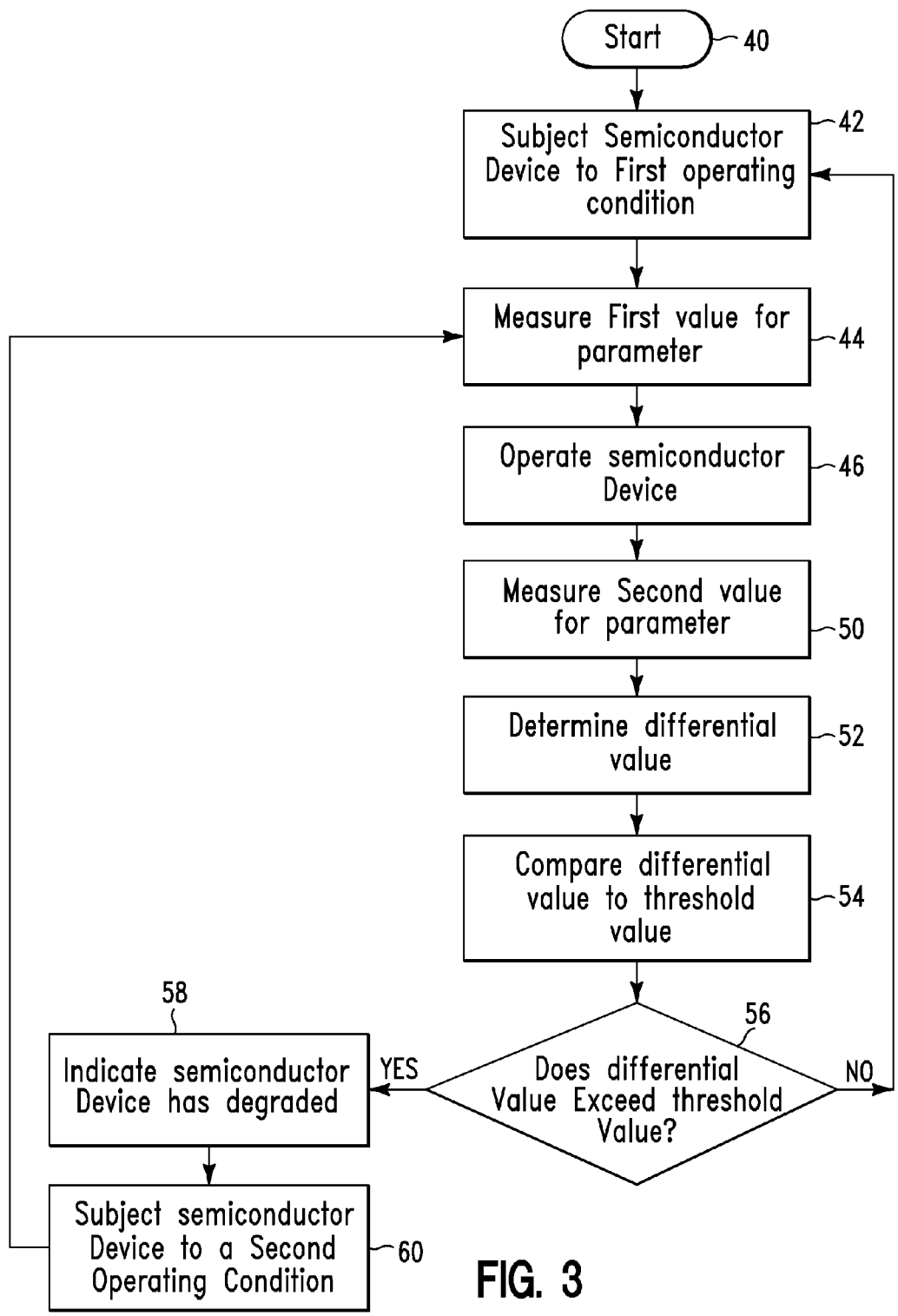
FIG. 3 is a flowchart describing an algorithm for implementing the selection circuit 2 of FIGS. 1 and 2, in accordance with embodiments of the present invention.

FIG. 3 is a flowchart describing an algorithm for implementing the selection circuit 2 of FIGS. 1 and 2, in accordance with embodiments of the present invention.

In step 40, the process is initiated. In step 42, the semiconductor device 1 is subjected to a first operating condition. In step 44, a first value for a parameter of a first circuit within the process sensitive circuits 15 is measured. In step 46, the semiconductor device 1 is operated at normal conditions. In step 50, a second value for the parameter of the first circuit within the process sensitive circuits 15 is measured. In step 52, a differential value between the first value and the second value is determined. In step 54, the differential value is compared to a predetermined threshold value. In step 56, it is determined if the differential value exceeds the predetermined threshold value.

If in step 56, it is determined that the differential value exceeds the predetermined threshold value then in step 58, the condition change circuit 28 indicates that the semiconductor device 1 has degraded. In step 60, the semiconductor device is subjected to a second operating condition and step 44 is repeated.

If in step 56, it is determined that the differential value does not exceed the predetermined threshold value then step 42 is repeated.

Figure 4:
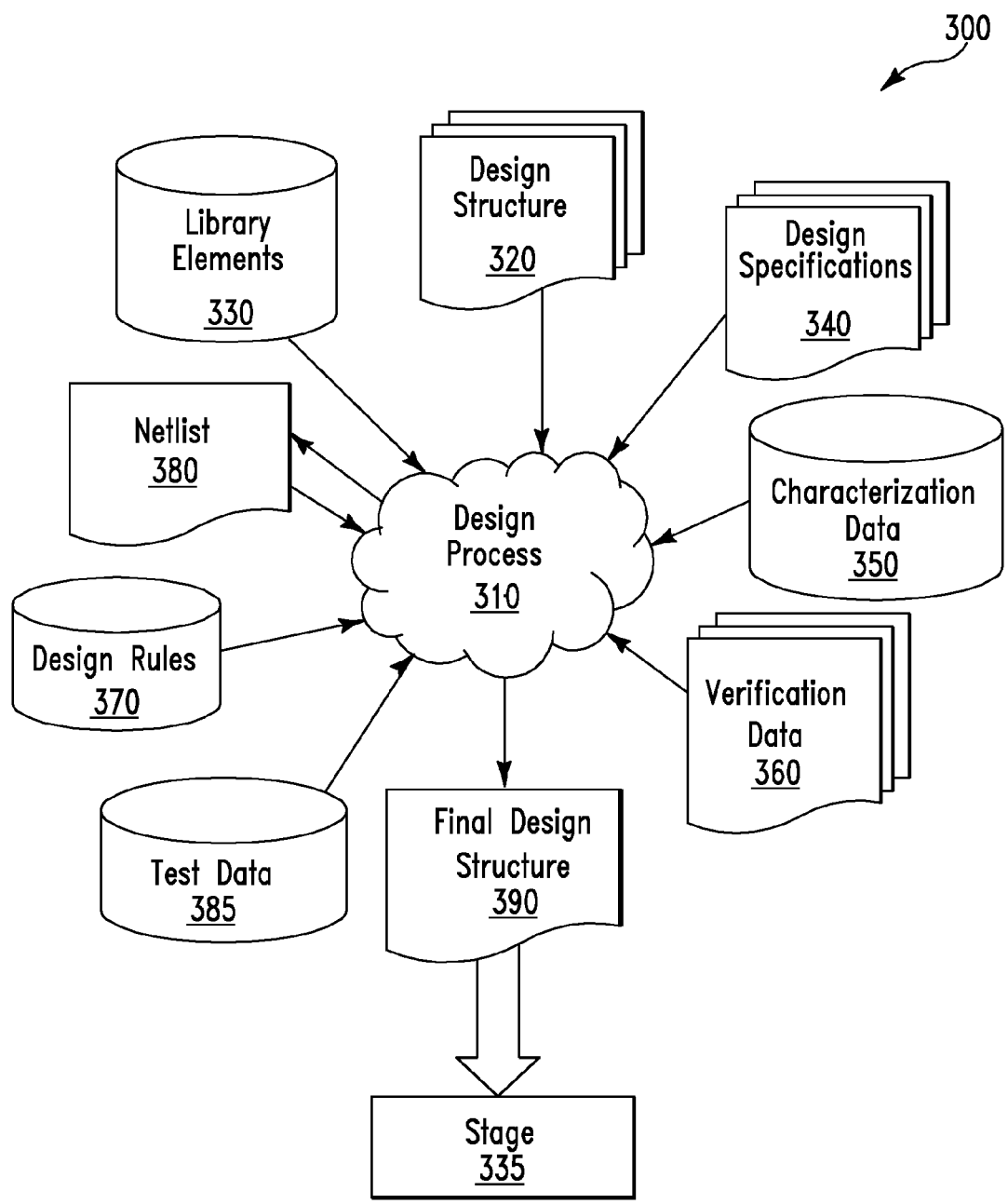
FIG. 4 is a flow diagram of a design process used in semiconductor design, manufacturing, and/or test, in accordance with embodiments of the present invention.

FIG. 4 is a flow diagram of a design process used in semiconductor design, manufacturing, and/or test, in accordance with embodiments of the present invention. In FIG. 4, a design flow 300 may vary depending on the type of IC being designed. For example, a design flow 300 for building an application specific IC (ASIC) may differ from a design flow 300 for designing a standard component. Design structure 320 is preferably an input to a design process 310 and may come from an IP provider, a core developer, or other design company or may be generated by the operator of the design flow, or from other sources. Design structure 320 comprises semiconductor device 1 in the form of schematics or HDL, a hardware-description language (e.g., Verilog, VHDL, C, etc.). Design structure 320 may be contained on one or more machine readable medium. For example, design structure 320 may be a text file or a graphical representation of semiconductor device 1. Design process 310 preferably synthesizes (or translates) semiconductor device 1 into a netlist 380, where netlist 380 is, for example, a list of wires, transistors, logic gates, control circuits, I/O, models, etc. that describes the connections to other elements and circuits in an integrated circuit design and recorded on at least one of machine readable medium. This may be an iterative process in which netlist 380 is re-synthesized one or more times depending on design specifications and parameters for the circuit.

Design process 310 may include using a variety of inputs; for example, inputs from library elements 330 which may house a set of commonly used elements, circuits, and devices, including models, layouts, and symbolic representations, for a given manufacturing technology (e.g., different technology nodes, 32 nm, 45 nm, 30 nm, etc.), design specifications 340, characterization data 350, verification data 360, design rules 370, and test data files 385 (which may include test patterns and other testing information). Design process 310 may further include, for example, standard circuit design processes such as timing analysis, verification, design rule checking, place and route operations, etc. One of ordinary skill in the art of integrated circuit design can appreciate the extent of possible electronic design automation tools and applications used in design process 310 without deviating from the scope and spirit of the invention. The design structure of the invention is not limited to any specific design flow.

Ultimately, design process 310 preferably translates semiconductor device 1, along with the rest of the integrated circuit design (if applicable), into a final design structure 390 (e.g., information stored in a general data stream (GDS) storage medium). Final design structure 390 may comprise information such as, for example, test data files, design content files, manufacturing data, layout parameters, wires, levels of metal, vias, shapes, test data, data for routing through the manufacturing line, and any other data required by a semiconductor manufacturer to produce semiconductor device 1. Final design structure 390 may then proceed to a stage 335 where, for example, final design structure 390: proceeds to tape-out, is released to manufacturing, is sent to another design house or is sent back to the customer.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A design structure comprising design data embodied in the format of a text file or a graphical representation of a circuit, said design structure stored on a computer readable storage medium, said design structure being usable as an input to a design process for designing, manufacturing, and/or testing an integrated circuit, said design structure describing a semiconductor device in the form of a hardware descriptive language, said hardware descriptive language comprising instructions that when executed by a processor translates said design structure into a final design structure, said design structure describing that said semiconductor device comprises:

a process sensitive circuit;
a measurement circuit, wherein said semiconductor device is subjected to a first operating condition, wherein said measurement circuit is for measuring a first value for a parameter of said process sensitive circuit at a first time, wherein said semiconductor device is operated such that said semiconductor device performs at least one intended function, wherein said measurement circuit is for measuring a second value for said parameter of said process sensitive circuit at a second time, and wherein said second time differs from said first time;
a calculation circuit for determining a first differential value between said first value and said second value; and
a control circuit for receiving an enable signal and enabling said measurement circuit.

2. The design structure of claim 1, further comprising:
a comparison circuit for comparing a threshold value to said first differential value to determine if said first differential value exceeds said threshold value.

3. The design structure of claim 2, further comprising:
a condition change circuit for enabling a second operating condition if said first differential value exceeds said threshold value, wherein said semiconductor device is subjected to said second operating condition, and wherein said first operating condition is different from said second operating condition.

4. The design structure of claim 3, wherein said semiconductor device is comprised by an apparatus, and wherein said apparatus automatically subjects said semiconductor device to said second operating condition.

5. The design structure of claim 3, wherein said measurement circuit periodically measures a plurality of values for said parameter, and wherein said calculation circuit determines differential values between said first value and each of said plurality of values.

6. The design structure of claim 2, further comprising a condition change circuit for transmitting to a user of an apparatus comprising said semiconductor device, a notification message that said first operating condition of said semiconductor device requires a change if said first differential value exceeds said threshold value.

7. The design structure of claim 6, wherein said notification message comprises a message selected from the group consisting of a visual message and an audible message.

8. The design structure of claim 2, further comprising:
a memory structure for storing, said first value, said second value, said first differential value, and said threshold value.

9. The design structure of claim 8, wherein said memory structure comprises a nonvolatile memory structure.

10. The design structure of claim 9, wherein said nonvolatile memory structure comprises a structure selected from the group consisting of an e-fuse structure, a laser fuse structure, and a RAM structure.

11. The design structure of claim 1, wherein the design structure resides on a GDS storage medium.

12. The design structure of claim 1, wherein the design structure includes at least one of test data files, characterization data, verification data, or design specifications.

13. The design structure of claim 1, wherein the design structure comprises a netlist, which describes said process sensitive circuit, said measurement circuit, said calculation circuit, and said control circuit.

* * * * *